(12) United States Patent
Nobori et al.

(10) Patent No.: US 7,848,075 B2
(45) Date of Patent: Dec. 7, 2010

(54) ELECTROSTATIC CHUCK WITH HEATER

(75) Inventors: Kazuhiro Nobori, Handa (JP); Tetsuya Kawajiri, Handa (JP); Akiyoshi Hattori, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 603 days.

(21) Appl. No.: 11/777,318

(22) Filed: Jul. 13, 2007

(65) Prior Publication Data

US 2008/0266745 A1 Oct. 30, 2008

(30) Foreign Application Priority Data

Jul. 19, 2006 (JP) .............................. 2006-196794
Jul. 9, 2007 (JP) .............................. 2007-180309

(51) Int. Cl.
*H01L 21/683* (2006.01)

(52) U.S. Cl. ..................................... 361/234

(58) Field of Classification Search .................. 361/234
See application file for complete search history.

(56) References Cited

U.S. PATENT DOCUMENTS

| 4,261,085 A | * | 4/1981 | Nishio et al. ............... 445/7 |
| 6,001,760 A | * | 12/1999 | Katsuda et al. ............. 501/98.4 |
| 6,133,557 A | | 10/2000 | Kawanabe et al. |
| 6,617,514 B1 | | 9/2003 | Ushikoshi et al. |
| 7,267,741 B2 | * | 9/2007 | Ren ......................... 156/345.1 |
| 2002/0110709 A1 | * | 8/2002 | Katsuda et al. ............. 428/698 |
| 2005/0023270 A1 | * | 2/2005 | Hiramatsu et al. ......... 219/444.1 |
| 2005/0152089 A1 | | 7/2005 | Matsuda et al. |
| 2006/0169688 A1 | | 8/2006 | Mori et al. |
| 2007/0169890 A1 | * | 7/2007 | Shishido et al. ......... 156/345.29 |

FOREIGN PATENT DOCUMENTS

| JP | 11-012053 A1 | | 1/1999 |
| JP | 2001284267 A | * | 10/2001 |
| KR | 2005-0067085 | | 6/2005 |
| KR | 2006-0067832 | | 6/2006 |

\* cited by examiner

*Primary Examiner*—Stephen W Jackson
*Assistant Examiner*—Scott Bauer
(74) *Attorney, Agent, or Firm*—Burr & Brown

(57) ABSTRACT

An electrostatic chuck with a heater including: a base which is composed of a sintered body containing alumina, an electrode disposed in an upper part of the base, and a resistance heating element embedded in a lower part of the base. The base includes a dielectric layer between the electrode and an upper surface of the base and a supporting member between the electrode and a lower surface of the base. The dielectric layer has a carbon content of not more than 100 ppm, and the supporting member has a carbon content of 0.03 to 0.25 wt %. Moreover, the resistance heating element is formed into a coil and mainly composed of niobium.

2 Claims, 2 Drawing Sheets

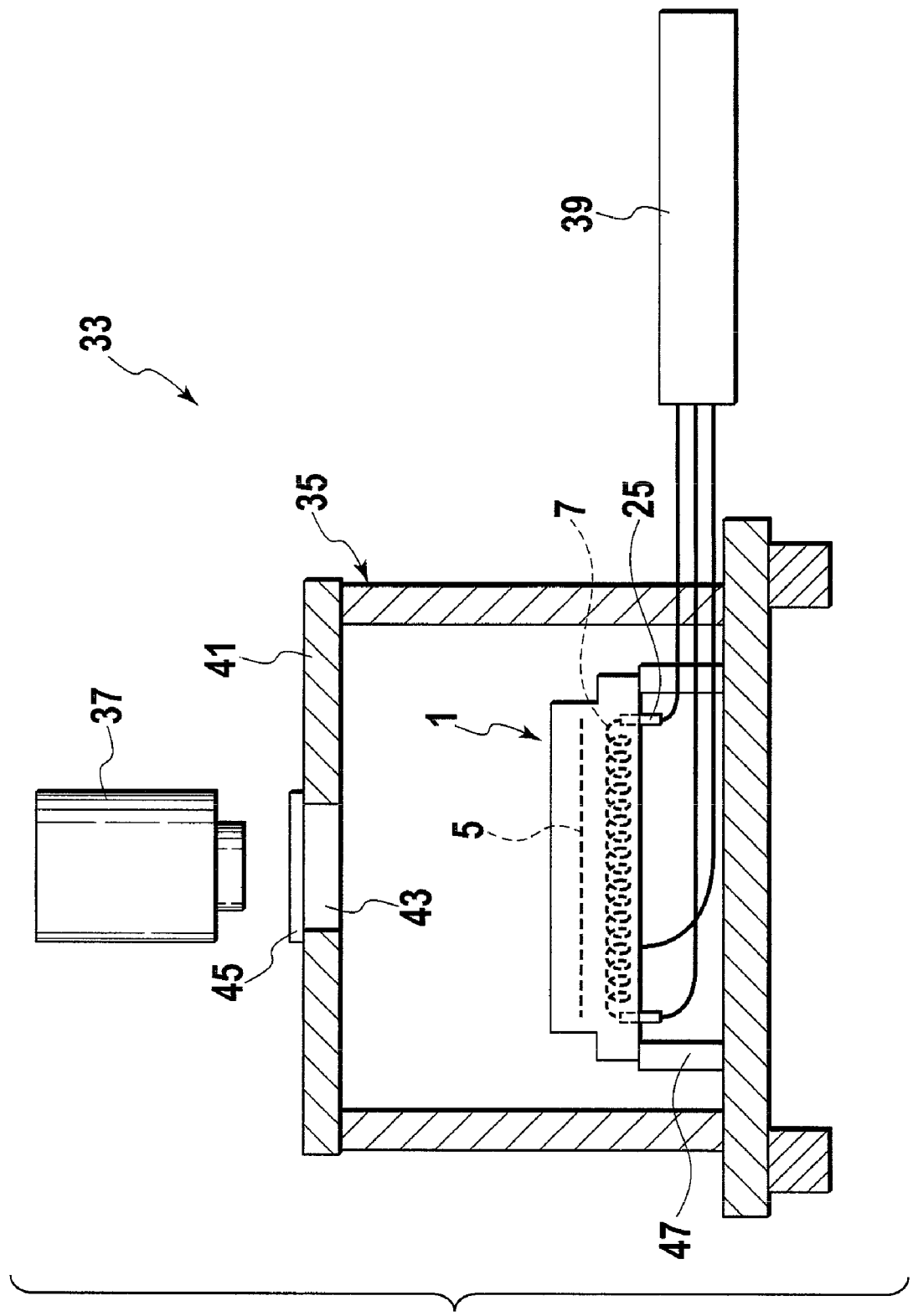

ELECTROSTATIC CHUCK WITH HEATER

CROSS-REFERENCE TO RELATED APPLICATION

This application is based upon and claims the benefit of priority from Japanese Patent Application No. 2006-196794 filed on Jul. 19, 2006, and No. 2007-180309, filed on Jul. 9, 2007; the entire contents of which are incorporated herein by reference.

BACKGROUND OF THE INVENTION

1. Field of the Invention

The present invention relates to a coulomb-type electrostatic chuck with a heater.

2. Description of Related Art

In manufacturing semiconductor devices and the like, a coulomb-type electrostatic chuck with a heater has hitherto been used. This electrostatic chuck with a heater includes a base made of ceramic. In the base, electrodes and a resistance heating element are disposed. The upper surface of the base is formed as a substrate holding surface on which a substrate such as a wafer is placed. Part of the base between the electrode and the substrate holding surface is formed as a dielectric layer, and another part between the electrode and the lower surface of the base is formed as a supporting member (for example, see Japanese Patent Laid-open Publication No. 11-12053).

However, in the aforementioned conventional electrostatic chuck with a heater, since the dielectric layer has a small volume resistivity, chucking and de-chucking response of a substrate placed on the substrate holding surface may be insufficient. The slower the chucking and de-chucking response of the substrate is, the longer it takes for the substrate to be separated from the electrostatic chuck. This increases processing time and reduces substrate processing capability per unit time.

Moreover, the main component of the resistance heating element is niobium (Nb), and the niobium may diffuse into the supporting member. The diffusion of the niobium increases resistance of the entire resistance heating element, and part of the resistance heating element from which the niobium component has diffused has a heat density different from a desired design value. Moreover, the diffusion degree of the niobium varies by location in the base, and the temperature distribution in the substrate holding surface is broadened, thus causing a problem of reduction in thermal uniformity of the substrate. Such reduction in thermal uniformity of the substrate makes it difficult to obtain uniform etching or film formation in a semiconductor-manufacturing process. The yield of manufactured devices may be therefore reduced.

Accordingly, an object of the present invention is to provide an electrostatic chuck with a heater in which the volume resistivity of the dielectric layer is increased to improve the chucking and de-chucking response of a substrate placed on the substrate holding surface and niobium as a main component of the resistance heating element is prevented from diffusing into the supporting member.

To achieve the aforementioned object, an electrostatic chuck with a heater according to the present invention includes: a base which is composed of a sintered body containing alumina; an electrode embedded in an upper part of the base: and a resistance heating element embedded in a lower part of the base, the base including a dielectric layer between the electrode and an upper surface of the base and a supporting member between the electrode and a lower surface of the base. The dielectric layer has a carbon content of not more than 100 ppm, and the supporting member has a carbon content of 0.03 to 0.25 wt %. Moreover, the resistance heating element is formed into a coil and mainly composed of niobium.

The electrostatic chuck with a heater according to the present invention has the following effects.

1) The carbon content of the supporting member is 0.03 to 0.25 wt %. It is therefore possible to prevent diffusion of niobium as a main component of the resistance heating element. By preventing the diffusion of the niobium component, the resistance heating element is allowed to have prescribed resistance, thus providing an effect on achieving heating density of a desired design value. Furthermore, the alumina sintered body of the supporting member is colored gray-black or black and efficiently radiates heat from the resistance heating element, thus providing an effect on an increase in heating efficiency. It is therefore possible to provide an effect on good thermal uniformity of the heated substrate.

2) The resistance heating element is formed in a coil and embedded in the supporting member. Accordingly, part of the supporting member above the resistance heating element and part below the same are joined to each other more firmly than the case where a resistance heating element is composed of a thin film obtained by screen printing or the like. Moreover, the resistance heating element is formed into a coil and radiates heat three-dimensionally. Accordingly, the resistance heating element can transmit heat to the substrate holding surface more efficiently than the resistance heating element composed of a thin film obtained by screen printing or the like.

3) The dielectric layer has a low carbon content of not more than 100 ppm and accordingly has high volume resistivity. When this electrostatic chuck is employed as a coulomb-type electrostatic chuck, the chucking and de-chucking response of a substrate placed on the substrate holding surface can be improved.

4) The resistance heating element is mainly composed of niobium and has a thermal expansion coefficient close to that of the base containing alumina. Accordingly, it is possible to reduce thermal distortion occurring between the resistance heating element and part surrounding the same when the resistance heating element is heated. It is therefore possible to obtain an electrostatic chuck with a heater which has a long life; is resistant to failure; and has a high long-term reliability even after repeated heat cycles.

BRIEF DESCRIPTION OF THE DRAWINGS

FIG. 3 is a cross-sectional side view of a thermal uniformity measuring device used in examples.

DETAILED DESCRIPTION OF THE INVENTION

Hereinafter, a description is given of an embodiment of the present invention.

[Electrostatic Chuck]

Figure 1:
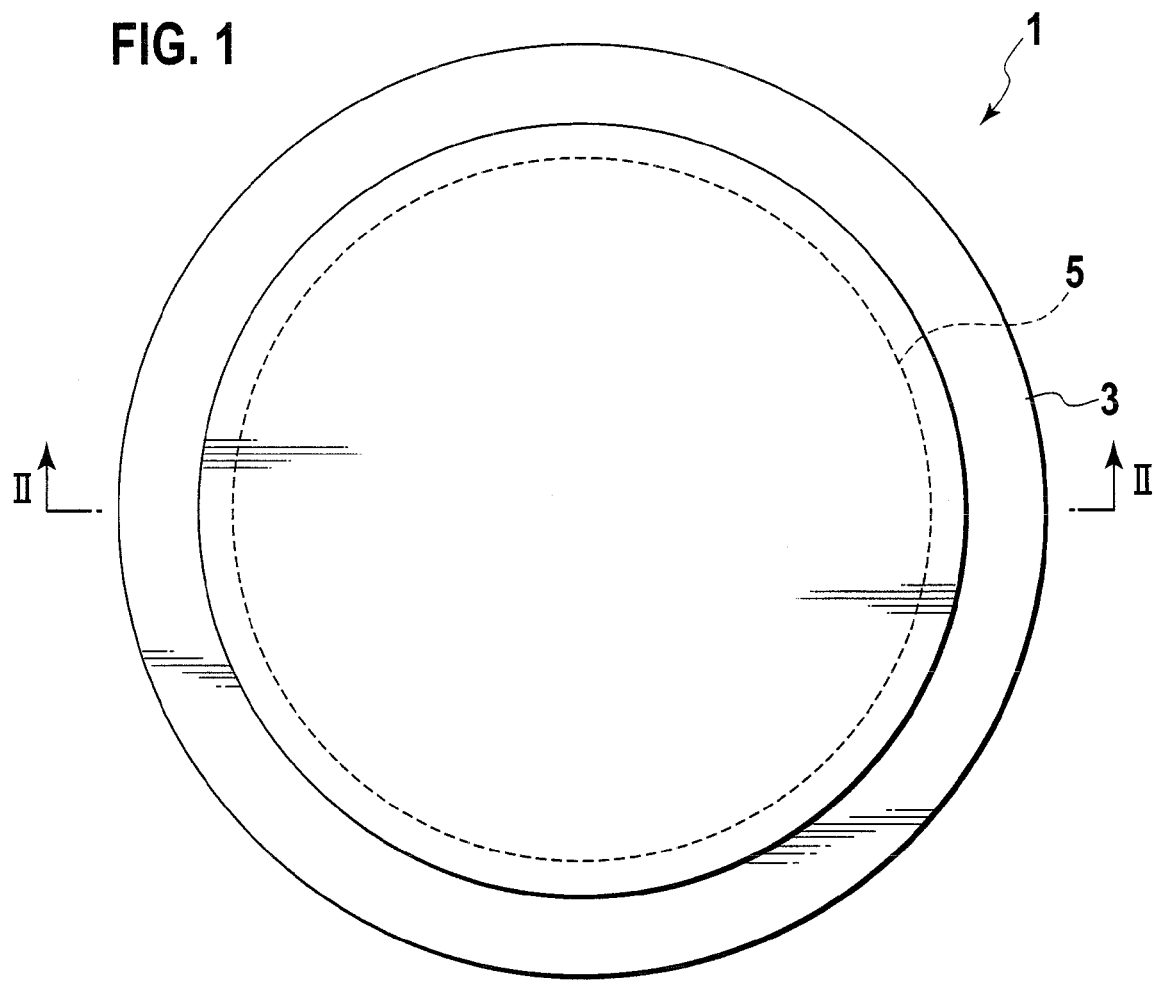
FIG. 1 is a top view showing an electrostatic chuck with a heater according to an embodiment of the present invention.
Figure 2:
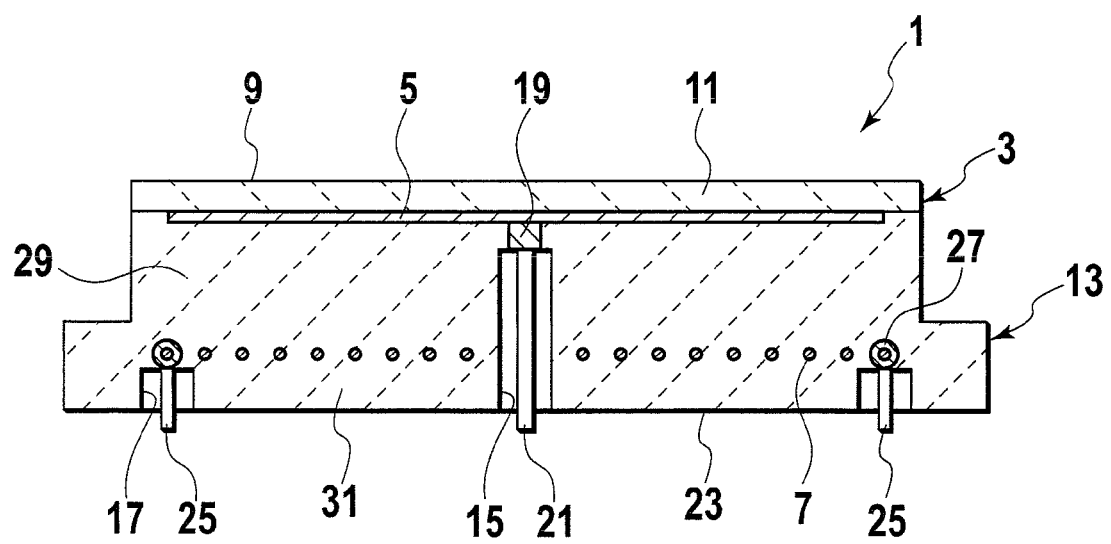
FIG. 2 is a cross-sectional view taken along a line II-II of FIG. 1.

FIG. 1 is a top view showing an electrostatic chuck with a heater according to the embodiment of the present invention. FIG. 2 is a cross-sectional view taken along a line II-II of FIG. 1.

As shown in FIGS. 1 and 2, an electrostatic chuck 1 with a heater according to an embodiment of the present invention includes: a base 3 composed of a sintered body containing alumina; an electrode 5 embedded in upper part of the base 3; and a resistance heating element 7 embedded in lower part of the base 3.

[Base]

The base 3 is formed into a disk as shown in FIGS. 1 and 2. The upper surface (front surface) of the base 3 is formed as a substrate holding surface 9 on which a substrate such as a wafer is placed. Part of the base 3 above the electrode 5, that is, part between the electrode 5 and substrate holding surface 9 is formed as a dielectric layer 11. Part of the base 3 below the electrode 5, that is, part between the electrode 5 and the lower surface (rear surface) of the base 3 is formed as a supporting member 13.

The dielectric layer 11 has a low carbon content of 100 ppm or less and accordingly has a high volume resistivity. When the electrostatic chuck 1 with a heater of this embodiment is employed as a coulomb type, therefore, it is possible to improve the chucking and de-chucking response of a substrate placed on the substrate holding surface 9.

[Electrode]

As shown in FIGS. 1 and 2, the electrode 5, which has a disk shape smaller than the base 3 in diameter, is embedded in the upper part of the substrate 3. This electrode 5 is mainly composed of tungsten carbide and further contains not less than 5 vol % and not more than 20 vol % of alumina. Preferably, the content of tungsten carbide in the electrode 5 is 70 to 95 vol %.

As shown in FIG. 2, in radial center part of the base 3, an accommodation hole 15 extending upward from the lower surface of the base 3 is formed. In the accommodation hole 15, an electrode power supply member 21 is disposed. An upper end of the electrode power supply member 21 is connected to the electrode 5 through a connection member 19. When power is supplied to the electrode 5 from the electrode power supply member 21 through the connection member 19, an electrostatic attraction force (Coulomb force) occurs in the dielectric layer 11 of the base 3, and the substrate is adsorbed onto the substrate holding surface 9 of the base 3.

The electrode 5 can be a mesh-shaped, comb-shaped, or disk-shaped electrode or the like printed with printing paste containing metal powder of alumina and tungsten carbide. The electrode 5 may be wire mesh or punched metal.

Since the electrode 5 is mainly composed of tungsten carbide and contains not less than 5 vole and not more than 20 vol % of alumina, the alumina particles are three-dimensionally coupled and penetrate the tungsten carbide layer in a net-like fashion to be joined with alumina of the supporting member 13 and dielectric layer 11. Accordingly, joint strengths between the electrode 5 and supporting member 13 and between the electrode 5 and dielectric layer 11 are larger than those in the case where an electrode is made of only tungsten carbide. Tungsten carbide does not react with alumina and has a thermal expansion coefficient smaller than that of alumina. The electrode formed of only tungsten carbide has low joint strength and may be degraded by thermal cycles. However, by mixing alumina in the base 3, the thermal expansion coefficient of the electrode 5 becomes close to that of alumina, thus improving long-term reliability.

[Resistance Heating Element]

The resistance heating element 7 is formed into a coil and mainly composed of niobium. Preferably, the content of niobium in the resistance heating element 7 is 95 wt % or more. The resistance heating element 7 may contain a metal component other than niobium, for example, platinum (Pt).

As shown in FIG. 2, the resistance heating element 7 is embedded in the supporting member 13 and arranged below the electrode 5. Resistance heating element power supply members 25 are disposed within accommodation holes 17 extending upward from a lower surface 23 of the base 3. Upper ends of the resistance heating element power supply members 25 are connected to the resistance heating element 7 through connection members 27. When power is supplied from the resistance heating element power supply members 25 to the resistance heating element 7 through the connection members 27, the resistance heating element 7 heats and supplies heat to the substrate placed on the substrate holding surface 9.

The resistance heating element 7 according to the embodiment is formed into a coil and embedded in the supporting member 13. The resistance heating element 7 can therefore join an upper part 29 of the supporting member 13 above the resistance heating element 7 and a lower part 31 below the same more firmly than a resistance heating element composed of a thin film obtained by screen printing or the like.

Since the resistance heating element 7 is formed into a coil and radiates heat three-dimensionally, the resistance heating element 7 can transmit heat to the substrate holding surface 9 more efficiently than a thin film obtained by screen printing. Moreover, since the resistance heating element 7 contains platinum or niobium, the difference in thermal expansion coefficient between the resistance heating element 7 and base 3 containing alumina is reduced.

The supporting member 13 has a high carbon content of 0.03 to 0.25 wt %. Accordingly, contained carbon reacts with the niobium component to form extremely thin carbonized and oxidized phases in the surface of the resistance heating element 7. Niobium in these carbonized and oxidized phases diffuses very slowly, and the carbonized phase hardly reacts with alumina. The carbonized and oxidized phases serve as a barrier film in such a manner, thus preventing the niobium of the resistance heating element 7 from diffusing into the supporting member 13.

[Manufacturing Method of Electrostatic Chuck with Heater]

A description is given of a procedure to manufacture the electrostatic chuck with a heater according to this embodiment.

The electrostatic chuck 1 is manufactured with a position of FIG. 2 turned upside down. Specifically, the dielectric layer 11 is prepared, the electrode 5 is formed on the dielectric layer 11, and then the supporting member 13 is formed on the electrode 5.

<Preparation of Dielectric Layer>

First, the dielectric layer 11 of the base 3 is prepared. The carbon content of this dielectric layer 11 is set 100 ppm or less as previously described.

As ceramic raw powder, high-purity alumina powder (for example, 99.7%) and MgO raw powder as a sintering agent are used. This ceramic raw powder is added with polyvinyl alcohol (PVA) as a binder, water, a dispersant and then mixed by a trommel for a predetermined period of time (for example, 16 hours) to prepare slurry. Preferably, the amount of PVA mixed is, for example, 2 wt %. The obtained slurry is sprayed and dried using a spray drier to obtain granulated powder for calcination. The calcination is performed by holding the granulated powder in an oxidation atmosphere such as air, for example, at 500° C. for five hours to remove the binder from the granulated powder. The calcined alumina granulated powder is thus manufactured. By removing the binder containing carbon, the carbon content of the dielectric layer 11 can be reduced.

Next, a mold is filled with the above calcined alumina granulated powder and subjected to press molding at predetermined pressure to prepare an alumina compact. Subsequently, this alumina compact is set in a sagger made of carbon and then sintered using a hot press sintering method. The sintering is performed in a nitrogen atmosphere with a predetermined pressure applied to, thus obtaining an alumina sintered body. The carbon content of the alumina sintered body as the dielectric layer 11 is 100 ppm or less.

<Formation of Electrode>

Next, the above alumina sintered body is ground to produce a disk with a predetermined size (for example, diameter: φ340 mm, thickness: 6 mm). In this grinding, one of the front and rear surfaces of the disk is ground to be finished into a smooth surface.

Subsequently, tungsten carbide powder as a material of the electrode 5, not less than 5 vol % and not more than 20 vol % of alumina powder, and the binder are mixed to prepare a paste. The electrode 5 is formed on the smooth surface of the alumina sintered body by screen printing of the paste and then dried.

<Formation of Supporting Member>

The alumina sintered body with the electrode 5 formed thereon is set in a mold, and alumina granulated powder is filled in the mold so as to cover the electrode 5 for press molding at predetermined pressure. The upper part 29 of the supporting member 13 shown in FIG. 2 is thus formed. This alumina granulated powder contains a binder and is not subjected to calcination.

The alumina granulated powder may be prepared as follows. Alumina powder and MgO raw powder as a sintering agent are added with polyvinyl alcohol (PVA) as the binder, water, a dispersant, and the like and then mixed by a trommel for a predetermined period of time (for example, 16 hours), thus preparing slurry. Preferably, the amount of PVA mixed as the binder is 0.7 to 3 wt %. The obtained slurry is sprayed and dried using a spray drier to obtain the alumina granulated powder.

Next, the coil-shaped resistance heating element 7 is placed on the upper part 29 of the supporting member 13 (or, the bottom surface of the upper part 29 of the supporting member 13 in FIG. 2), and the alumina granulated powder is filled to cover the upper part 29 for press molding at predetermined pressure.

The alumina body as the base 3 is thus prepared.

<Sintering of Base>

Subsequently, the above alumina body is set in a carbon sagger and sintered using hot press sintering or the like. The sintering is performed by holding the alumina body with predetermined pressure applied in a nitrogen atmosphere at high temperature for a predetermined period of time. Thereafter, the surface of the alumina sintered body which has been subjected to the sintering process twice is ground by a diamond grinding wheel for adjustment of the thickness of the alumina sintered body, thus forming the dielectric layer 11. Furthermore, the side surface of the alumina sintered body is ground. Moreover, necessary drilling is performed, and the power supply members 21 and 25 are attached, thus completing the electrostatic chuck with a heater.

The carbon content of the dielectric layer obtained by the aforementioned preparation method is not more than 100 ppm, and the carbon content of the supporting member can be set to 0.03 to 0.25 wt %. The carbon content of the supporting member 13 is controlled by the amount of binder mixed when the alumina granulated powder is prepared. The carbon content of the supporting member 13 may be controlled by properly selecting a temperature increasing speed during the sintering, the concentration of oxygen in the atmosphere, and the like other than the amount of mixed binder.

According to the aforementioned method, a part of carbon contained in the binder remains after sintering and diffuses as an impurity carbon in the alumina sintered body of the supporting member 13. The alumina sintered body is colored gray-black or black and efficiently radiates heat from the resistance heating element 7, thus providing an effect on an increase in heating efficiency.

The resistance heating element 7 and carbon in the alumina sintered body react with each other to form very thin carbonized and oxidized phases in the surface of the resistance heating element 7. In these carbonized and oxidized phases, metal diffuses very slowly. Accordingly, these carbonized and oxidized phases together serve as a protection layer to prevent the diffusion of niobium into the alumina sintered body.

EXAMPLES

Next, the present invention is concretely described using examples.

[Examination 1]

First, as Examination 1, a plurality of examples of the base 3 with various values of the carbon contents of the dielectric layer 11 and supporting member 13 were prepared, and it was examined whether the niobium component of the resistance heating element 7 diffused into the supporting member 13.

Specifically, Examples 1 to 4 were examples of the electrostatic chuck 1 in which the carbon content of the dielectric layer 11 was less than 100 ppm and the carbon content of the supporting member 13 was 0.03 to 0.25 wt %, and Comparative Examples 1 to 8 were examples of the electrostatic chuck 1 in which the carbon content of the dielectric layer 11 or supporting member 13 was out of the aforementioned range.

First, a description is given of a procedure to manufacture an electrostatic chuck of Example 1.

As the ceramic raw powder, alumina powder with a purity of 99.7% (particle size: 1 μm) and MgO raw powder as the sintering agent were used. The content of MgO in the ceramic raw powder was 0.04 wt %. This ceramic raw powder was added with 2 wt % of polyvinyl alcohol (PVA) as the binder, water, and the dispersant and then mixed by a trommel for 16 hours, thus preparing slurry.

The obtained slurry was sprayed and dried using a spray drier and then held at 500° C. for five hours for removal of the binder, thus preparing alumina granulated powder with an average particle size of about 80 μm. The obtained alumina granulated powder was filled in a mold and subjected to press molding with a pressure of 200 kg/cm$^2$.

Subsequently, the above alumina compact was set in a carbon sagger and sintered using hot press sintering. The sintering was performed with a pressure of 100 kg/cm$^2$ applied thereto in a nitrogen pressurized atmosphere (pressure: 150 kPa). The temperature was increased at 300° C./hour and maintained at 1600° C. for two hours. The alumina sintered body was thus obtained.

Next, the alumina sintered body was ground to prepare a disk (diameter: φ340 mm, thickness: 6 mm). At this time, one of the front and rear surfaces of the disk was ground to be finished into a smooth surface with a surface roughness Ra of not more than 0.8 μm.

80 vol % of tungsten carbide (WC), 20 vol % of alumina, and terpineol as the binder were mixed to prepare the printing paste. The electrode 5 (diameter: φ290 mm, thickness: 10 μm) was formed on the smooth surface of the alumina sintered body and dried.

Thereafter, the alumina sintered body with the printed electrode 5 formed thereon was set in a mold, and alumina granulated powder which contained 3 wt % of the binder and were not subjected to calcination was filled in the mold for press molding at a pressure of 200 kg/cm².

The coil-shaped resistance heating element 7 made of niobium was placed thereon, and alumina granulated powder which contained 3 wt % of the binder and were not subjected to calcination was filled in the mold to cover the resistance heating element 7 for press molding at a pressure of 200 kg/cm².

Subsequently, the thus-obtained alumina compact was set in a carbon sagger and sintered using hot press sintering. The sintering was carried out with a pressure of 100 kg/cm² applied thereto in a nitrogen pressurized atmosphere (pressure: 150 kPa). The temperature was increased at 300° C./hour and maintained at 1600° C. for two hours. The alumina sintered body including the electrode 5 and resistance heating element 7 embedded therein was thus obtained.

Thereafter, the front surface of the alumina sintered body subjected to the sintering process twice was subjected to surface grinding with a diamond grinding wheel for adjustment of the thickness of the alumina sintered body. Furthermore, the side surface of the alumina sintered body was ground. Moreover, necessary drilling was carried out, and the power supply members 21 and 25 were pulled out, thus preparing the electrostatic chuck 1 of Example 1.

Examples 2 to 4 and Comparative Examples 1 to 8 of the electrostatic chuck 1 were prepared by the same procedure as that of Example 1 described above except that the amount of the binder added in the dielectric layer 11 and the like were adjusted as shown in Tables 1 and 2.

The values in vol % written in ESC electrode material fields of the following Tables 1 to 3 indicate the contents of alumina ($Al_2O_3$). For example, the ESC electrode material of Example 1 contains 20 vol % of alumina. Moreover, the ESC electrode material in Comparative Example 10 of Table 3 described later was composed of only tungsten carbide (WC). (Table 1)

TABLE 1

| | | Example 1 | Example 2 | Example 3 | Example 4 |
|---|---|---|---|---|---|
| Dielectric Layer | Amount of Binder | 2 wt % | 2 wt % | 2 wt % | 2 wt % |
| | Calcination | calcined | calcined | calcined | calcined |
| | Carbon Content of Sintered body | <100 ppm | <100 ppm | <100 ppm | <100 ppm |
| | Volume Resistivity [ohm-cm] RT | >1E+17 | >1E+17 | >1E+17 | >1E+17 |
| | Volume Resistivity [ohm-cm] 200° C. | 1E+16 | 9E+15 | 2E+16 | 8E+15 |
| ESC Electrode Material | | WC + $Al_2O_3$ 20 vol % | WC + $Al_2O_3$ 20 vol % | WC + $Al_2O_3$ 20 vol % | WC + $Al_2O_3$ 20 vol % |
| Supporting Member | Amount of Binder | 3 wt % | 2 wt % | 1.1 wt % | 0.7 wt % |
| | Calcination | Not calcined | Not calcined | Not calcined | Not calcined |
| | Carbon Content of Sintered body | 0.25 wt % | 0.18 wt % | 0.05 wt % | 0.03 wt % |
| | Volume Resistivity [ohm-cm] RT | 8E+16 | 1E+17 | >1E+17 | >1E+17 |
| | Volume Resistivity [ohm-cm] 200° C. | 1E+13 | 2E+13 | 1E+14 | 2E+14 |
| | Insulation Voltage [KV/mm] | 15 | 19 | 20 | 20 |
| | Nb Diffusion | Not diffused | Not diffused | Not diffused | Not diffused |
| | Thermal Uniformity (In-plane Variation) ΔT | 3° C. | 3° C. | 3° C. | 3° C. |
| | HT Resistance (Design Calculated Value: 10Ω) | 10Ω | 10Ω | 10Ω | 10Ω |

TABLE 2

| | | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Dielectric Layer | Amount of Binder | 5 wt % | 3 wt % | 2 wt % | 2 wt % | 2 wt % | 2 wt % | 2 wt % | 2 wt % |
| | Calcination of granulated powder | Not calcined | Not calcined | Not calcined | Not calcined | Not calcined | Not calcined | Not calcined | Not calcined |
| | Carbon Content of Sintered body | 0.32 wt % | 0.20 wt % | 0.15 wt % | 0.16 wt % | 0.14 wt % | 0.15 wt % | 0.15 wt % | 0.16 wt % |
| | Volume Resistivity [ohm-cm] RT | 5E+15 | 8E+16 | 1E+17 | >1E+17 | >1E+17 | 1E+17 | 8E+16 | 1E+17 |
| | Volume Resistivity [ohm-cm] 200° C. | 5E+11 | 9E+12 | 5E+13 | 4E+13 | 5E+13 | 6E+13 | 4E+13 | 5E+13 |
| ESC electrode material | | WC + $Al_2O_3$ 20 vol % | WC + $Al_2O_3$ 20 vol % | WC + $Al_2O_3$ 20 vol % | WC + $Al_2O_3$ 20 vol % | WC + $Al_2O_3$ 20 vol % | WC + $Al_2O_3$ 20 vol % | WC + $Al_2O_3$ 20 vol % | WC + $Al_2O_3$ 20 vol % |
| Supporting member | Amount of Binder | 2 wt % | 2 wt % | 2 wt % | 2 wt % | 0.3 wt % | 13 wt % | 11 wt % | 5 wt % |
| | Calcination of granulated powder | Not calcined | Not calcined | Not calcined | calcined | Not calcined | Not calcined | Not calcined | Not calcined |
| | Carbon Content of Sintered body | 0.20 wt % | 0.19 wt % | 0.18 wt % | <100 ppm | 0.01 wt % | 0.6 wt % | 0.5 wt % | 0.38 wt % |

TABLE 2-continued

|  |  | Comparative Example 1 | Comparative Example 2 | Comparative Example 3 | Comparative Example 4 | Comparative Example 5 | Comparative Example 6 | Comparative Example 7 | Comparative Example 8 |
|---|---|---|---|---|---|---|---|---|---|
| Volume Resistivity [ohm-cm] | RT | 7E+16 | 8E+16 | 9E+16 | >1E+17 | >1E+17 | 9E+14 | 1E+15 | 4E+15 |
|  | 200° C. | 1E+13 | 2E+13 | 2E4+13 | 4E+13 | 3E+13 | 8E+10 | 1E+11 | 5E+11 |
| Insulation Voltage [KV/mm] |  | 17 | 18 | 19 | 15 | 15 | 8 | 10 | 13 |
| Nb diffusion |  | Not diffused | Not diffused | Not diffused | Diffused | Diffused | Not diffused | Not diffused | Not diffused |
| Thermal Uniformity (In-plane Variation) ΔT |  | 5° C. | 4° C. | 5° C. | 15° C. | 10° C. | 7° C. | 6° C. | 5° C. |
| HT Resistance (Design Calculated Value: 10Ω) |  | 10Ω | 10Ω | 10Ω | 15Ω | 13Ω | 10Ω | 10Ω | 10Ω |

In Example 1 described above, in terms of the volume resistivity of the dielectric layer 11, Examples 1 to 4 were higher than those of Comparative Examples 1 to 8 both at room temperature and 200° C. In other words, the carbon content of the dielectric layer 11 of 100 ppm or less could provide a high volume resistivity optimal for the coulomb-type electrostatic chuck with a heater.

In terms of insulation voltage of the supporting member 13, Examples 1 to 4 were higher than Comparative Examples 6 to 8. In terms of thermal uniformity, Examples 1 to 4 were better than Comparative Examples 6 to 8. By setting the carbon content of the supporting member 13 to not more than 0.25 wt %, the volume resistivity of the supporting member 13 could be maintained so as to secure practically high enough insulation voltage, and the thermal uniformity could be also improved since leakage current from the resistance heating element 7 was small.

The diffusion of the niobium of the resistance heating element 7 into the supporting member 13 did not occur in all Examples 1 to 4 but occurred in Comparative Examples 4 and 5. Moreover, in terms of in-plane variations in temperature in the substrate holding surface 9 and resistance of the resistance heating element 7, Examples 1 to 4 were better than Comparative Examples 1 to 8. The reason for this reduction of the variations in temperature is thought to be because the diffusion of niobium of the resistance heating element 7 into the supporting member 13 was suppressed and the desired temperature distribution was achieved as designed. By setting the carbon content of the supporting member 13 to 0.03 wt % or more, the thermal uniformity of the substrate adsorbed by the electrostatic chuck with a heater was considerably improved.

[Examination 2]

Next, another examination was made whether adhesive strength of the electrode 5 varied depending on the material of the electrode 5. Specifically, as Examples 5 to 7, examples of the electrostatic chuck 1 with the electrode 5 containing tungsten carbide and not less than 5 vol % or not more than 20 vol % of alumina were prepared, and as Comparative Examples 9 and 10, examples of the electrostatic chuck 1 disposed with the electrode 5 whose content of alumina was out of the above range.

The procedure to manufacture the electrostatic chucks was the same as that of aforementioned Example 1. The material of the electrode 5 and the like were shown in the Table 3.

TABLE 3

|  |  | Example 5 | Example 6 | Example 7 | Comparative Example 9 | Comparative Example 10 |
|---|---|---|---|---|---|---|
| Dielectric Layer | Amount of Binder | 2 wt % | 2 wt % | 2 wt % | 2 wt % | 2 wt % |
|  | Calcination of granulated powder | calcined | calcined | calcined | calcined | calcined |
|  | Carbon Content of Sintered body | <100 ppm | <100 ppm | <100 ppm | <100 ppm | <100 ppm |
|  | Volume Resistivity [ohm-cm] RT | >1E+17 | >1E+17 | >1E+17 | >1E+17 | >1E+17 |
|  | 200° C. | 1E+16 | 9E+15 | 8E+15 | 8E+15 | 9E+15 |
| ESC Electrode Material |  | WC + $Al_2O_3$ 10 vol % | WC + $Al_2O_3$ 20 vol % | WC + $Al_2O_3$ 5 vol % | WC + $Al_2O_3$ 22 vol % | WC |
| ESC Electrode Adhesive Strength (Shear Strength) |  | 200 MPa | 250 MPa | 180 MPa | 80 MPa | 50 MPa |
| Supporting Member | Amount of Binder | 2 wt % | 2 wt % | 2 wt % | 2 wt % | 2 wt % |
|  | Calcination of granulated powder | Not calcined | Not calcined | Not calcined | Not calcined | Not calcined |
|  | Carbon Content of Sintered body | 0.20 wt % | 0.18 wt % | 0.19 wt % | 0.19 wt % | 0.19 wt % |
|  | Volume Resistivity [ohm-cm] RT | >1E+17 | 1E+17 | >1E+17 | 9E+16 | 9E+16 |
|  | 200° C. | 6E+13 | 5E+13 | 4E+13 | 3E+13 | 3E+13 |
|  | Insulation Voltage [KV/mm] | 20 | 20 | 20 | 19 | 18 |

TABLE 3-continued

|  | Example 5 | Example 6 | Example 7 | Comparative Example 9 | Comparative Example 10 |
| --- | --- | --- | --- | --- | --- |
| Nb diffusion | Not diffused | Not diffused | Not diffused | Not diffused | Not diffused |
| Thermal Uniformity (In-plane Variation) ΔT | 3° C. | 3° C. | 3° C. | 4° C. | 3° C. |
| HT Resistance (Design Calculated Value: 10Ω) | 10Ω | 10Ω | 10Ω | 10Ω | 10Ω |

As shown in Table 3, it was found that Examples 5 to 7 were higher than Comparative Examples 9 and 10 in adhesive strength of the electrode 5. When the content of alumina was 22 vol % or more, not only was the adhesive strength too low, but the impedance of the ESC electrode was also too high, which was not preferable. A lower impedance is preferable because a high frequency current is sometimes applied to the ESC electrode.

[Measuring Method]

Hereinafter, a description is given of a method of measuring each measurement value in Examinations 1 and 2.

First, the carbon content of the alumina sintered body was measured by the high-frequency heating infrared absorption method.

The volume resistivity was measured in an air atmosphere (temperature: 23° C.) and at 200° C. by a method based on JIS C2141. A voltage of 1000 V/mm was applied, and a current value was read 30 minutes after the application of voltage was started for calculation of the volume resistivity.

Shear strength was measured by a microdroplet method to check the adhesive strength of the ESC electrode. The used measuring device was a composite material interface property evaluation apparatus (Tohei Sangyo Corporation). A disk (diameter: φ9.9 mm, thickness: 12 mm) was cut out from the prepared base 3 so that the electrode 5 was positioned in the radial center thereof for measurement of the shear strength.

The insulation voltage was measured in an air atmosphere (temperature: 23° C.) by a method based on JIS C2141.

In terms of the diffusion of Nb of the resistance heating element 7 to part therearound, a part including the resistance heating element 7 was cut out from the alumina sintered body, and the cross-section thereof was ground. It was then checked by an EPMA (electron probe micro-analysis) whether Nb was diffused.

In terms of the thermal uniformity, as shown in FIG. 3, the electrostatic chuck 1 was put in a vacuum chamber 35, and temperature in the substrate holding surface 9 was measured by an infrared camera at low pressure (lower than 1E-3 Torr) with control temperature set to 100° C.

Hereinafter, the structure of the thermal uniformity measuring device of FIG. 3 is briefly described.

A thermal uniformity measuring device 33 includes the box-shaped vacuum chamber 35; an infrared camera 37 above the vacuum chamber 35; and a controller 39 connected to the electrostatic chuck 1. In an upper wall 41 of the vacuum chamber 35, an opening 43 was formed and covered with a sapphire glass 45. The infrared camera 37 was disposed above the opening 43. In the bottom surface of the vacuum chamber 35, foot portions 47 were disposed. The electrostatic chuck 1 was placed on the foot portions 47. The resistance heating element power supply member 25 of the electrostatic chuck 1 was connected to the controller 39.

In terms of the resistance of the resistance heating element 7, resistance between electrode terminals was measured in the air atmosphere (temperature: 23° C.) using a digital multimeter (TR6847: Advantest Corporation).

The invention claimed is:

1. An electrostatic chuck with a heater, comprising:
    a base which is composed of a sintered body containing alumina;
    an electrode disposed in an upper part of the base; and
    a resistance heating element embedded in a lower part of the base, the base including a dielectric layer between the electrode and an upper surface of the base and a supporting member between the electrode and a lower surface of the base, wherein
    the dielectric layer has a carbon content of not more than 100 ppm, and the supporting member has a carbon content of 0.03 to 0.25 wt %, and
    the resistance heating element is formed into a coil and mainly composed of niobium.

2. The electrostatic chuck with a heater according to claim 1, wherein the electrode is mainly composed of tungsten carbide and contains not less than 5 vol % and not more than 20 vol % of alumina.

* * * * *